United States Patent [19]
Galbraith et al.

[11] Patent Number: 6,072,368
[45] Date of Patent: Jun. 6, 2000

[54] PHASE LOCKED LOOP UNLOCK DETECTOR

[75] Inventors: Richard Leo Galbraith; Larry A. Navarro, Jr., both of Rochester; Todd Carter Truax, Zumbrota, all of Minn.

[73] Assignee: International Business Machines Corporation, Armonk, N.Y.

[21] Appl. No.: 09/176,137

[22] Filed: Oct. 21, 1998

[51] Int. Cl.[7] ............................. G11B 5/00; G11B 27/10
[52] U.S. Cl. ................................. 331/DIG. 2; 331/1 A; 327/160; 360/51; 369/59; 369/124; 375/376
[58] Field of Search ................. 360/51, 67; 331/DIG. 2, 331/1 A; 369/47, 48, 59, 124; 375/376; 327/159, 160

[56] References Cited

U.S. PATENT DOCUMENTS 5,663,688  9/1997  Delmas et al. .......................... 331/14

*Primary Examiner*—Arnold Kinkead
*Attorney, Agent, or Firm*—Joan Pennington

[57] ABSTRACT

A phase locked loop unlock detector is provided for a data detection channel in a direct access storage device (DASD). The phase locked loop unlock detector includes a counter for generating a threshold reference relative to a reference signal. An unlock window generator is coupled to the counter for generating an unlock window signal. An unlock error detector is coupled to the unlock window generator for comparing a variable frequency signal with the unlock window signal.

10 Claims, 5 Drawing Sheets

PHASE LOCKED LOOP UNLOCK DETECTOR

FIELD OF THE INVENTION

The present invention relates to apparatus for detecting data, and more particularly to, a phase locked loop unlock detector for a data detection channel in a direct access storage device (DASD).

DESCRIPTION OF THE PRIOR ART

Direct access storage devices (DASDs) often incorporating stacked, commonly rotated rigid magnetic disks are used for storage of data in magnetic form on the disk surfaces. Data is recorded in concentric, radially spaced data information tracks arrayed on the surfaces of the disks. Transducer heads driven in a path toward and away from the drive axis write data to the disks and read data from the disks.

Phase locked loop (PLL) circuits are widely used in many different applications. One known implementation of detecting 360 phase unlock conditions in a disk file used separate counters to frame a counting period for the variable signal, and to check its phase relative to the reference. Each counter required a separate clock, one at a divided down reference rate and another at the variable rate. This known implementation required significant power consumption as well as chip space. Also large amounts of error generation and reporting logic is used.

For small files, space and power constraints become integral to the design. A voltage controlled oscillator (VCO) unlock detector is needed that can be implemented in the data channel of a small disk file. A need exists for an efficient and effective voltage controlled oscillator (VCO) unlock detector for use in a disk file data channel.

SUMMARY OF THE INVENTION

A principal object of the present invention is to provide a phase locked loop unlock detector for a data detection channel in a direct access storage device (DASD). Other important objects are to provide such phase locked loop unlock detector substantially without negative effects and that overcomes many of the disadvantages of prior art arrangements.

In brief, a phase locked loop unlock detector is provided for a data detection channel in a direct access storage device (DASD). The phase locked loop unlock detector includes a counter for generating a threshold reference relative to a reference signal. An unlock window generator is coupled to the counter for generating an unlock window signal. An unlock error detector is coupled to the unlock window generator for comparing a variable frequency signal with the unlock window signal.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Figure 1:
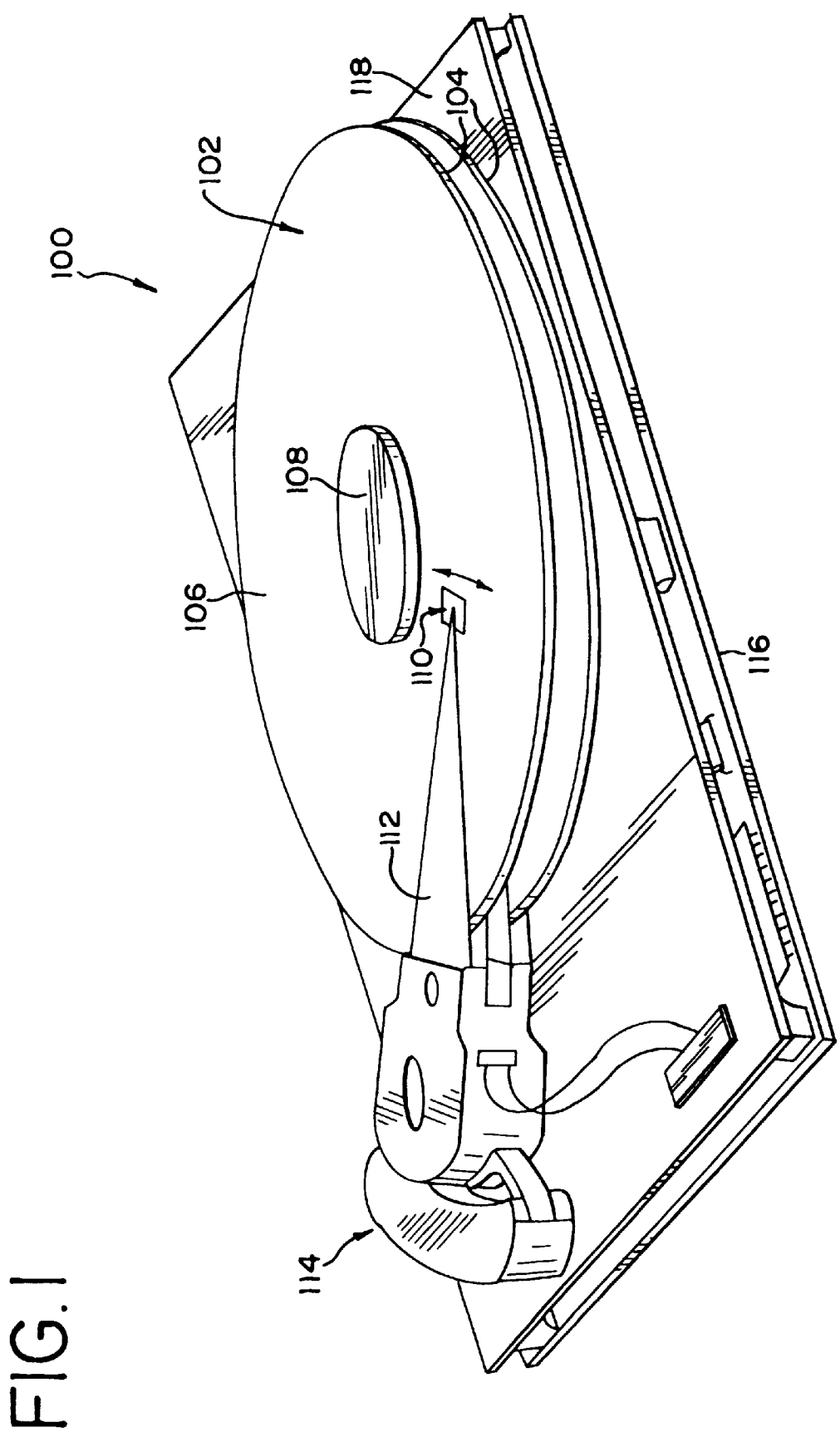
FIG. 1 is a diagrammatic view of a direct access storage device (DASD) embodying the present invention.

Having reference now to the drawings, in FIG. 1 there is illustrated a direct access data storage device (DASD) generally designated as 100 including a stack 102 of disks 104 each having at least one magnetic surface 106. The disks 104 are mounted parallel to one another for simultaneous rotation on and by an integrated spindle and motor assembly 108. Information on each magnetic disk surface 106 is read from or written to the disk surface 106 by a corresponding transducer head assembly 110 movable in a path having a radial component across the rotating disk surface 106.

Each transducer head assembly 110 is carried by an arm 112. The arms 112 are ganged together for simultaneous pivotal movement by a voice coil motor (VCM) magnet assembly 114. Drive signals applied to the VCM magnet assembly 114 cause the arms 112 to move in unison to position the transducer head assemblies 110 in registration with information storage tracks on the disk surfaces 106 where information is written or read. As shown in FIG. 1, an electronics card 116 is mounted together with a base support 118 of DASD 100. The utility of the present invention is not restricted to the details of a particular DASD construction.

Figure 2:
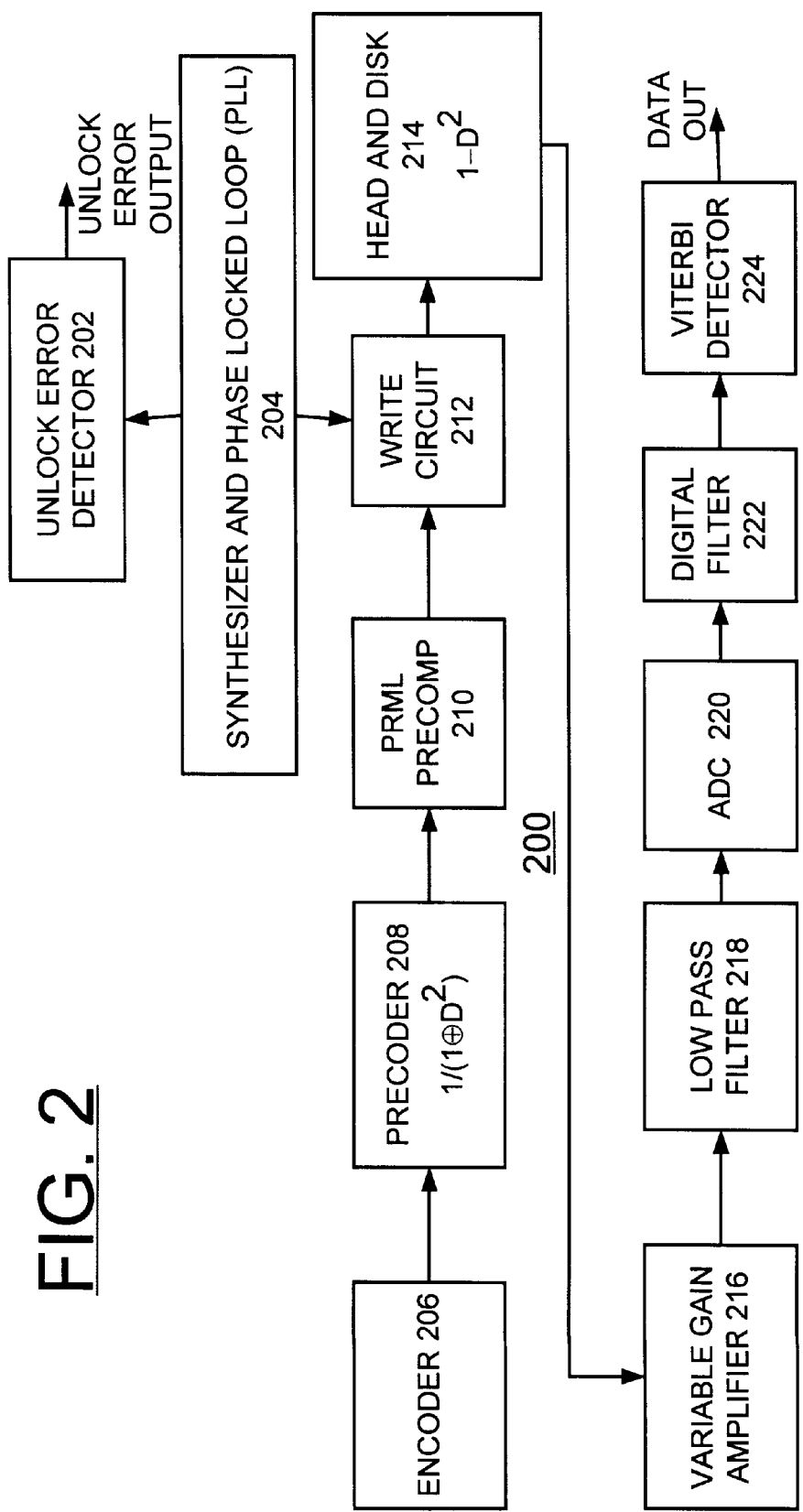
FIG. 2 is a block diagram of a data channel embodying the present invention of the direct access storage device (DASD) of FIG. 1.

Referring now to FIG. 2, there is shown a block diagram of a partial-response maximum-likelihood (PRML) channel 200 available in the DASD 100 including an improved phase lock loop unlock detector 202 of the invention used with a synthesizer and phase locked loop (PLL) 204.

In accordance with features of the invention, the phase lock loop unlock detector 202 is a low power phase lock loop unlock detector that utilizes a small space. Data to be written is applied to an encoder 206 for providing a modulation coded output having predefined run length constraints.

A precoder 208 follows the encoder 206 described by a $1/(1 \oplus D^2)$ operation where D is a unit delay operator and the symbol $\oplus$ is used to represent modulo-2 addition. Modulo-2 addition can be thought of as an exclusive or operation. A PRML precomp 210 coupled to the precoder 208 provides a modulated binary pulse signal applied to a write circuit 212 that provides the modulated write current for writing to the disk surface. An analog read signal is obtained at head and disk block 214 described by the $(1-D^2)$ operation. The read signal is applied to a variable gain amplifier (VGA) 216 and the amplified read signal is applied to a lowpass filter 218. The filtered read signal is converted to digital form by an analog-to-digital converter (ADC) 220 that provides, for example, 64 possible 6-bit sampled values. The samples of the ADC 220 are applied to a digital filter 222, such as a finite impulse response (FIR) digital filter. The filtered signal from the digital filter 222 is applied to a Viterbi detector 224 to complete the data detection process for data read back. It should be understood that a class IV partial response (PR4) signal or other data detection signal and another type of detector can be used in the data channel 200.

Figure 3:
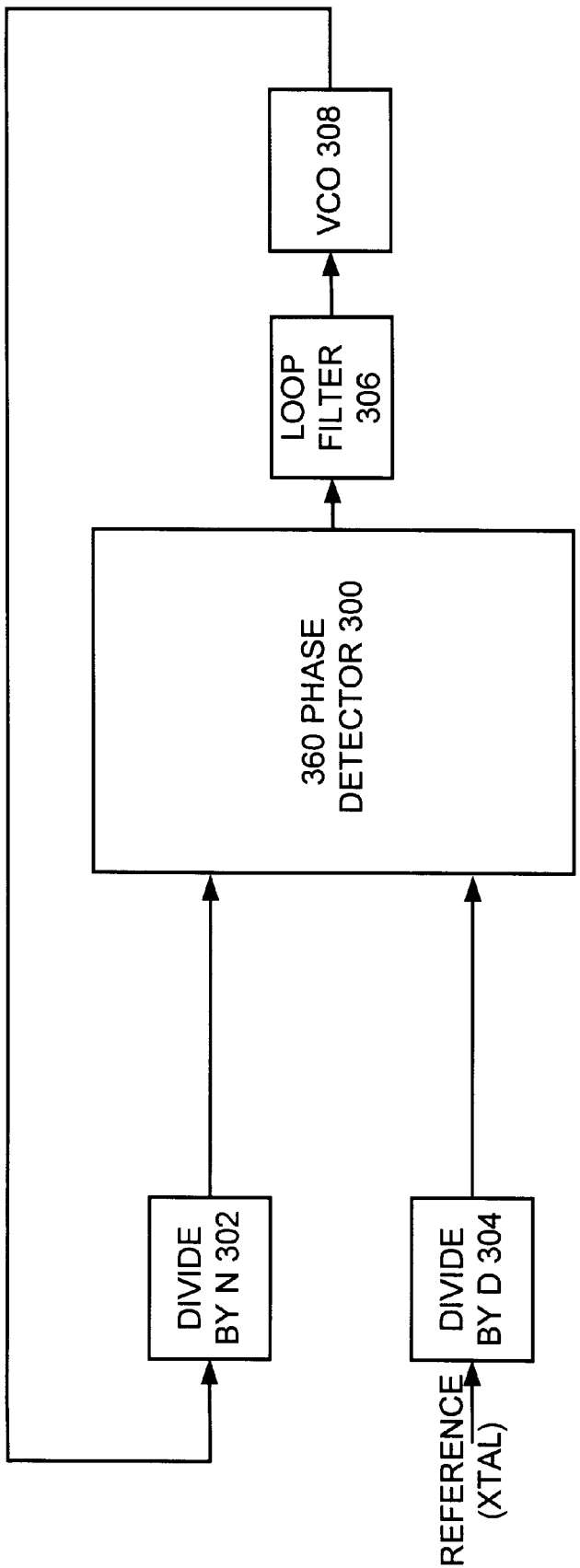
FIG. 3 is a block diagram representation of a phase detector with a voltage controlled oscillator.

As shown in FIG. 3, a 360 phase detector 300 compares incoming VARIABLE and REFERENCE signals. The VARIABLE signal is applied to the phase detector 300 from a Write VCO divide by N signal at an output of a divide by N 302. The REFERENCE signal is applied to the phase detector 300 from an output of a divide by D 304 receiving an input REFERENCE (XTAL). A loop filter 306 is coupled between the output of the phase detector 300 and a variable controlled oscillator (VCO) 308. The phase detector 300 compares the Write VCO divide by N signal and the REFERENCE divide by D signal. The phase detector 300 asserts a speed up or slow down signal to the VCO 308 if the VARIABLE frequency is too slow or too fast relative to the REFERENCE signal.

Figure 4:
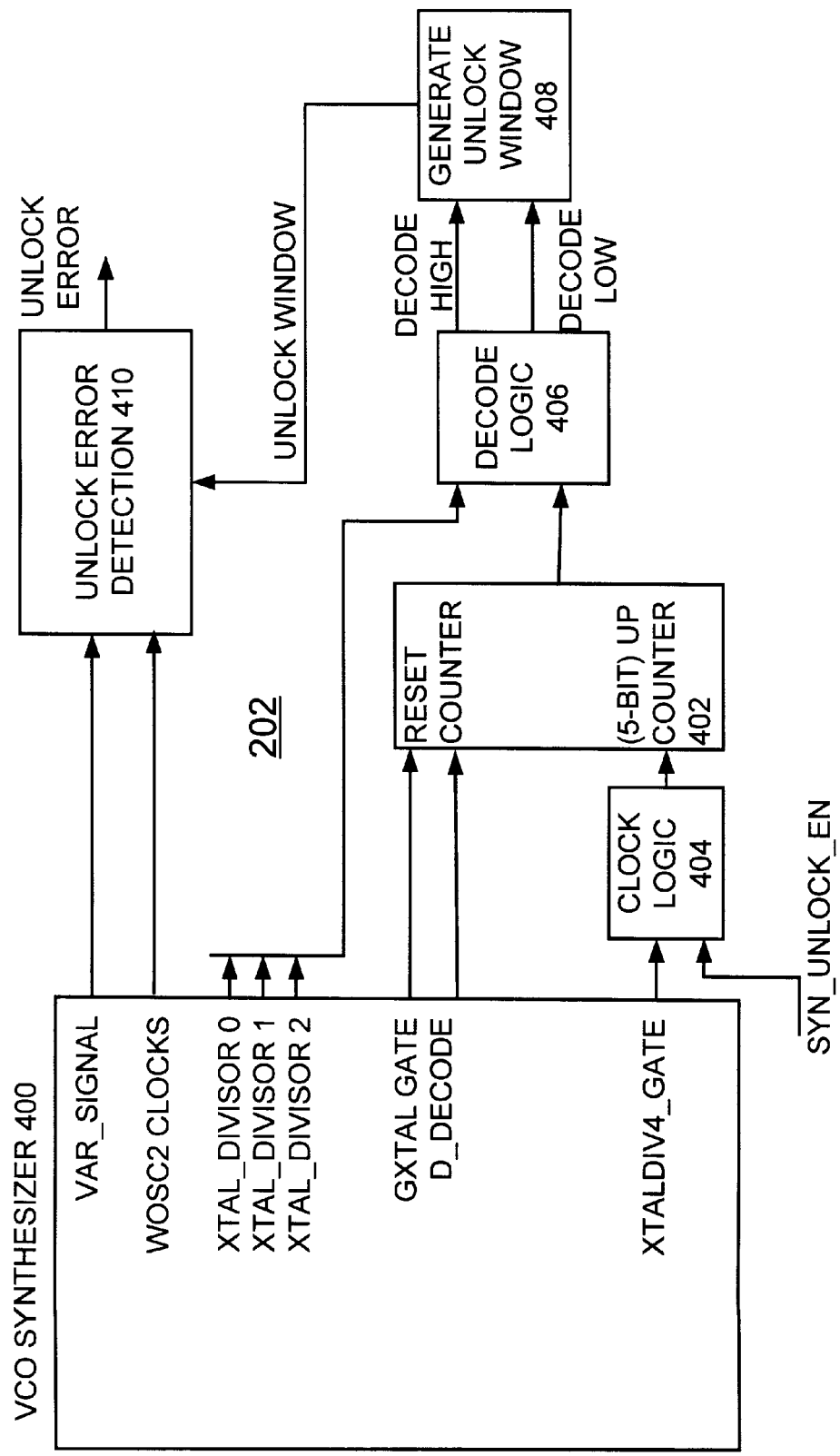
FIG. 4 is a block diagram representation of a phase lock loop unlock detector of FIG. 2 in accordance with the present invention.

Referring to FIG. 4, the phase lock loop unlock detector 202 in accordance with the present invention is illustrated. The phase lock loop unlock detector 202 compares the Write VCO divide by N signal and the REFERENCE divide by D signal to identify an unlock error condition. A VCO synthesizer 400 includes existing VCO synthesizer circuits used to clock a counter 402 of the unlock detector 202. The unlock detector 202 uses signals from the VCO Synthesizer 400 to clock its counter 402, generate an unlock window and detect an unlock condition.

The counter 402, such as a 5-bit up counter, is used to generate a threshold unlock window. A SYN_UNLOCK_EN input to a clock logic 404 enables the unlock detector 202. The enable bit, SYN_UNLOCK_EN must be held high prior to or at the same time as the enabling of the VCO Synthesizer 400. This will ensure that the latches in the unlock detector 202 flush to the correct values and are synchronous with the VCO synthesizers latches. The enable bit must be high throughout the operation of the unlock detector 202. If the unlock detector 202 is turned off during the operation of VCO synthesizer 400, the unlock detector 202 is not turned on again until the VCO synthesizer 400 is reset.

VCO synthesizer 400 signal, XTALDIV4_GATE, is a pseudo XTAL divide by 4 gated signal for generating divide by 4 clocks. The XTALDIV4_GATE signal is applied to the clock logic 404 providing the XTAL divide by 4 gated signal to the counter 402. VCO synthesizer 400 signal, GXTAL_GATE, used for resetting the counter 402, is a XTAL divide by 15 gated signal for generating divide by 15 clocks in VCO synthesizer circuit 400. D_DECODE is a divide by D decode from VCO synthesizer circuit 400 used with GXTAL_GATE for resetting the counter 402.

The counter output is applied to a decode logic 406. XTAL_DIVISOR<0:2> or XTAL DIVISOR 0, XTAL DIVISOR 1, and XTAL DIVISOR 2 are applied from the VCO synthesizer 400 to the decode logic 406. Outputs of the decode logic 406 labeled DECODE HIGH and DECODE LOW are applied to a generate unlock window block 408. The purpose of the decode logic 406 is to specify when to generate the unlock window. Since the unlock window scales with the XTAL Divisor D, different decodes are provided for each D value. Table 3 below illustrates the operation of decode logic 406 as a function of XTAL divisor (/D).

An unlock window output of block 408 indicated at a line UNLOCK WINDOW is applied to an unlock error detection block 410. The VAR_SIGNAL from the VCO synthesizer 400 is the Write VCO signal applied to the unlock error detection block 410 of the 360 phase unlock detector 202. The WOSC2 clocks from the VCO synthesizer 400 are the REFERENCE clock signals applied to the unlock error detection block 410. An unlock condition will occur when the rising edge of the VARIABLE Write VCO/N signal is trailing or leading the REFERENCE XTAL/D reference signal by a predefined percentage, such as about +/−25% of the XTAL/D period. The unlock error condition will occur when the rising edge of the VAR_SIGNAL is detected within the unlock window.

The UNLOCK_ERROR signal output of the unlock error detection block 410 reporting the VCO synthesizer unlock error is applied to an error register (not shown). A user may poll the error register prior to a write operation to determine if the write will occur at the desired frequency.

TABLE 3

| XTAL divisor (D) | Decode Low (XTAL/4 clocks) | Decode High (XTAL/4 clocks) |
|---|---|---|
| 15 | 1 | 3 |
| 30 | 2 | 6 |
| 45 | 3 | 9 |
| 60 | 4 | 12 |
| 75 | 5 | 15 |
| 90 | 6 | 18 |
| 105 | 7 | 21 |
| 120 | 8 | 24 |

Figure 5:
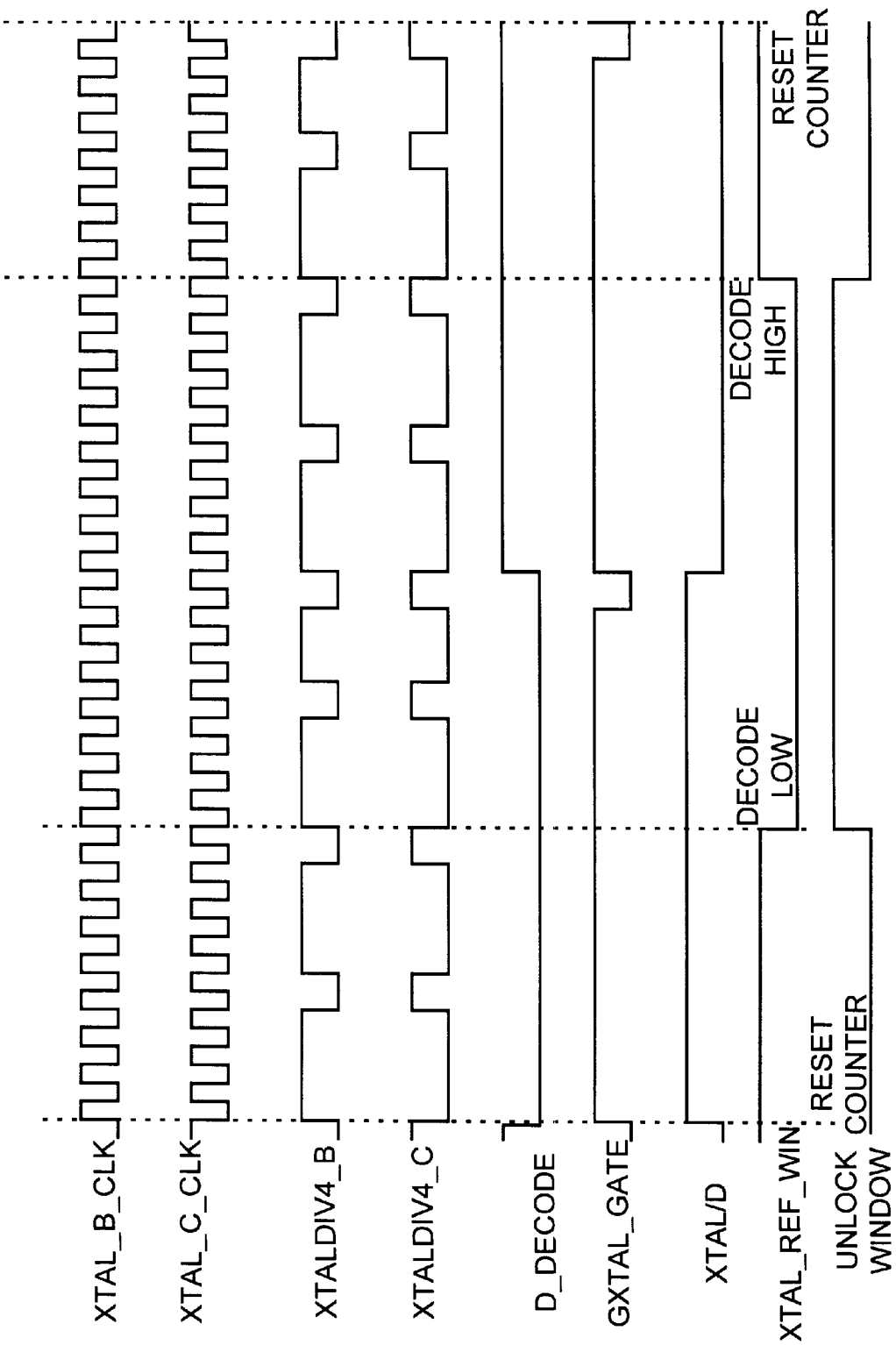
FIG. 5 is a chart illustrating an example of the operation of the phase lock loop unlock detector of FIG. 3 in accordance with the present invention.

Referring also to FIG. 5, exemplary signals from the VCO synthesizer 400 are shown that are used to generate the unlock windows. A divide by 15 primitive polynomial counter (PPC) within the VCO Synthesizer circuit 400 is used to generate a gate signal for the unlock detector 202. Logic is appended to the PPC to allow for decodes at 4, 8, 12 and 15 counts. The twelfth count is the exception to the XTAL/4 signal because there will be only 3 XTAL clocks between 12 and 15. This counter is also used to generate a gate for a divide by 15 signal in the Write VCO Synthesizer. Using this counter saves space and power since it is already needed for the VCO Synthesizer's operation. The primary function of this XTAL/4 signal is to clock a 5 bit up counter.

FIG. 5 shows an example of how the unlock window is generated. In FIG. 5 an XTAL divisor (XTAL /D) of 30 is used. At the beginning of a XTAL/D cycle, a reference window shown at a line XTAL_REF:WIN, is normally high. The signal DECODE_LOW pulls the reference window low. The signal DECODE_HIGH pulls the reference window high. From table 3 above, a pulse low, DECODE_LOW will occur at the second XTALDIV4 clock. The pulse high, DECODE_HIGH will occur at a count of 6. This will generate the reference window. This reference window is then inverted to create the unlock window. The counter will reset and the unlock window will be generated again. The process repeats every XTAL/D cycle.

Table 4 shows the amount of time it takes to detect an unlock error for D values of 30 and 45.

TABLE 4

Synthesizer Unlock Error Reporting
(XTAL = 50 Mhz)

| WOSC2/N frequency off from XTAL/D frequency | Sensing Time for D = 30 ($\mu$s) | Sensing Time for D = 45 ($\mu$s) |
|---|---|---|
| +0.5% [−0.5%] | 32.16 [28.14] | 48.25 [44.01] |
| +1.0% [−1.0%] | 16.16 [14.14] | 24.24 [22.12] |
| +1.5% [−1.5%] | 18.83 [9.47] | 16.24 [14.82] |
| +2.0% [−2.0%] | 8.16 [7.13] | 12.24 [11.17] |

For example, given the following conditions, WOSC2= 212 MHz; XTAL=40 MHz; Temperature=50° C.; Voltage= 3.4V a resulting unlock detector current of 0.09 mA or low power consumption for the unlock detector 202 is provided.

While the present invention has been described with reference to the details of the embodiments of the invention shown in the drawing, these details are not intended to limit the scope of the invention as claimed in the appended claims.

What is claimed is:

1. A phase locked loop unlock detector for a direct access storage device (DASD) comprising:

a counter for generating a threshold reference relative to a reference signal;

an unlock window generator coupled to said counter for generating an unlock window signal;

unlock error detector coupled to said unlock window generator for comparing a variable frequency signal with said unlock window signal; and a voltage controlled oscillator (VCO) synthesizer circuit and wherein said counter for generating said threshold reference relative to said reference signal receives a clock signal from said VCO synthesizer.

2. The phase locked loop unlock detector for a direct access storage device (DASD) as recited in claim 1 wherein said unlock error detector generates an error signal responsive to an identified rising edge of said variable frequency signal within said unlock window signal.

3. The phase locked loop unlock detector for a direct access storage device (DASD) as recited in claim 1 wherein said unlock error detector generates an error signal responsive to an identified rising edge of said variable frequency signal trailing or leading a reference signal by a predefined percentage of the reference signal period.

4. The phase locked loop unlock detector for a direct access storage device (DASD) as recited in claim wherein said clock signal is a REFERENCE frequency divide by four signal.

5. A phase locked loop unlock detector for a direct access storage device (DASD) comprising:

a counter for generating a threshold reference relative to a reference signal;

an unlock window generator coupled to said counter for generating an unlock window signal;

unlock error detector coupled to said unlock window generator for comparing a variable frequency signal with said unlock window signal; and an enable signal for applying a reference clock signal to said counter.

6. The phase locked loop unlock detector for a direct access storage device (DASD) as recited in claim 5 includes a voltage controlled oscillator (VCO) synthesizer circuit and wherein said counter is reset by a clock signal from said VCO synthesizer and said unlock window generator responsive to said counter being reset for generating said unlock window signal.

7. A direct access storage device including a data channel comprising:

at least one disk mounted for rotation about an axis and having at least one disk surface for storing data;

transducer means mounted for movement across said disk surface for reading and writing data to said disk surface;

a phase lock loop unlock detector including a counter for generating a threshold reference relative to a reference signal;

an unlock window generator coupled to said counter for generating an unlock window signal;

unlock error detector coupled to said unlock window generator for comparing a variable frequency signal with said unlock window signal, and for generating an error signal responsive to an identified rising edge of said variable frequency signal within an unlock window of said unlock window signal; and a voltage controlled oscillator (VCO) synthesizer circuit for generating a reference signal.

8. The direct access storage device including a data channel as recited in claim 7 wherein said counter is clocked by a clock signal from said VCO synthesizer.

9. The direct access storage device including a data channel as recited in claim 7 wherein said counter is reset by a clock signal from said VCO synthesizer.

10. A direct access storage device including a data channel comprising:

at least one disk mounted for rotation about an axis and having at least one disk surface for storing data;

transducer means mounted for movement across said disk surface for reading and writing data to said disk surface;

a phase lock loop unlock detector including a counter for generating a threshold reference relative to a reference signal;

an unlock window generator coupled to said counter for generating an unlock window signal;

unlock error detector coupled to said unlock window generator for comparing a variable frequency signal with said unlock window signal, and for generating an error signal responsive to an identified rising edge of said variable frequency signal within an unlock window of said unlock window signal; and an enable signal for applying a reference clock signal to said counter.

* * * * *